(12) United States Patent
Yudovsky et al.

(10) Patent No.: US 6,223,447 B1
(45) Date of Patent: May 1, 2001

(54) FASTENING DEVICE FOR A PURGE RING

(75) Inventors: Joseph Yudovsky, Campbell; Salvador Umotoy, Antioch; Lawrence C. Lei, Milpitas; Ronald Rose, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/504,288

(22) Filed: Feb. 15, 2000

(51) Int. Cl.[7] ............................................ F26B 17/24
(52) U.S. Cl. .................... 34/58; 34/615; 34/239; 118/725; 118/728
(58) Field of Search ........................... 34/83, 84, 58, 34/107, 615, 202, 239, 312, 317; 118/725, 728, 729, 730, 500

(56) References Cited

U.S. PATENT DOCUMENTS

| | | | |
|---|---|---|---|
| 5,238,499 | 8/1993 | van de Ven et al. ............... | 118/724 |
| 5,516,367 | 5/1996 | Lei et al. ........................... | 118/725 |
| 5,556,476 | 9/1996 | Lei et al. ........................... | 118/728 |
| 5,624,499 | * 4/1997 | Mizuno et al. ..................... | 118/725 |
| 5,688,331 | * 11/1997 | Aruga et al. ....................... | 118/725 |
| 5,766,365 | 6/1998 | Umotoy et al. ..................... | 118/728 |
| 5,800,686 | * 9/1998 | Littau et al. ....................... | 118/725 |
| 5,855,687 | * 1/1999 | DuBois et al. ..................... | 118/729 |
| 5,882,419 | 3/1999 | Sinha et al. ........................ | 118/729 |
| 5,888,304 | 3/1999 | Umotoy et al. .................... | 118/720 |
| 5,935,338 | * 8/1999 | Lei et al. ........................... | 118/725 |
| 5,985,033 | 11/1999 | Yudovsky et al. ................. | 118/715 |
| 5,994,678 | * 11/1999 | Zhao et al. ......................... | 118/725 |

* cited by examiner

*Primary Examiner*—Pamela Wilson
(74) *Attorney, Agent, or Firm*—Thomason, Moser & Patterson LLP

(57) ABSTRACT

A fastening device which prevents rotational and vertical displacement of a purge ring caused by purge gas exiting the purge ring or caused by other processing conditions. The fastening device comprises a clamp which releasably holds the purge ring together with the wafer support. A pin is inserted into a bore through the purge ring, wafer support and the clamp to releasably secure the clamp in place. Slots may be formed in the purge ring to guide placement of the clamp.

20 Claims, 3 Drawing Sheets

FASTENING DEVICE FOR A PURGE RING

BACKGROUND OF THE INVENTION

1. Field of the Invention

The present invention relates to the field of semiconductor substrate processing equipment. More particularly, this invention relates to a purge ring and associated fastening device.

2. Background of the Related Art

Chemical vapor deposition ("CVD") is one method used in semiconductor fabrication to deposit thin films on a substrate. CVD delivers precursor gases to a vacuum chamber and onto a substrate where the gases react and form a thin film thereon. One problem with CVD of material to the top surface of a substrate is that material also deposits on the edge and backside surfaces of the substrate. Because the edge and backside surfaces of a substrate are typically rougher than the highly polished top surface, material deposited on these surfaces tends to flake off creating particles within the system that can damage the chamber and substrates processed therein. In addition, material deposited on these surfaces may damage the integrity of a substrate by causing the substrate to adhere to the support member.

Purge gas has been used to prevent edge and backside deposition by delivering the purge gas to the edge of a substrate typically through a support member. For example, a purge ring is positioned on the support member adjacent to the periphery of the substrate. The purge ring forms an annular channel with the support member which directs the purge gas toward the edge of the substrate. The purge gas exerts a positive pressure near the perimeter portion of the substrate and reduces the likelihood that processing gases will reach the edge and backside surfaces of the substrate.

The purge ring can be fixedly attached to the support member by such methods as welding, bolting, brazing, or screwing. However, because material deposits on the purge ring and in the annular channel, removable purge rings are preferred to allow the purge ring to be easily and quickly cleaned or replaced. Purge rings are commonly gravitationally or frictionally held to the support member. Because removable purge rings are not fixedly attached to the support member, the purge gas or other process conditions may cause vertical or rotational displacement of the purge ring which can result in edge/backside deposition, particle generation, and damage to the edge of the substrate.

Movement of the purge ring is a significant problem when the purge ring is used with a ceramic pedestal. Ceramic pedestals are used in high temperature applications because aluminum pedestals can corrode, backsputter, and warp at high temperatures. However, a problem with ceramic is that it is more brittle than metal and more likely to crack. Thus, movement of the purge ring can damage the ceramic pedestal and can create particles within the system. In addition, the purge ring cannot be attached to the ceramic pedestal with common joining devices, such as welding, bolting, brazing, and screwing, because of the likelihood of cracking the ceramic components and the difficulty associated with working with ceramic components.

Therefore, there is a need for a purge ring and removable assembly which restricts vertical and rotational movement of the purge ring without damaging the pedestal or other system components.

SUMMARY OF THE INVENTION

The present invention generally provides a substrate support member having a purge ring and a fastening device for removably securing the purge ring to the substrate support member. In one embodiment of the invention, the fastening device comprises a clamp which releasably holds a purge ring to a substrate support member. The fastening device may further include a pin which releasably secures the clamp to the substrate support member. The pin is inserted into a bore through the purge ring, wafer support, and the clamp. The purge ring may include a slot formed therein to guide placement of the clamp.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
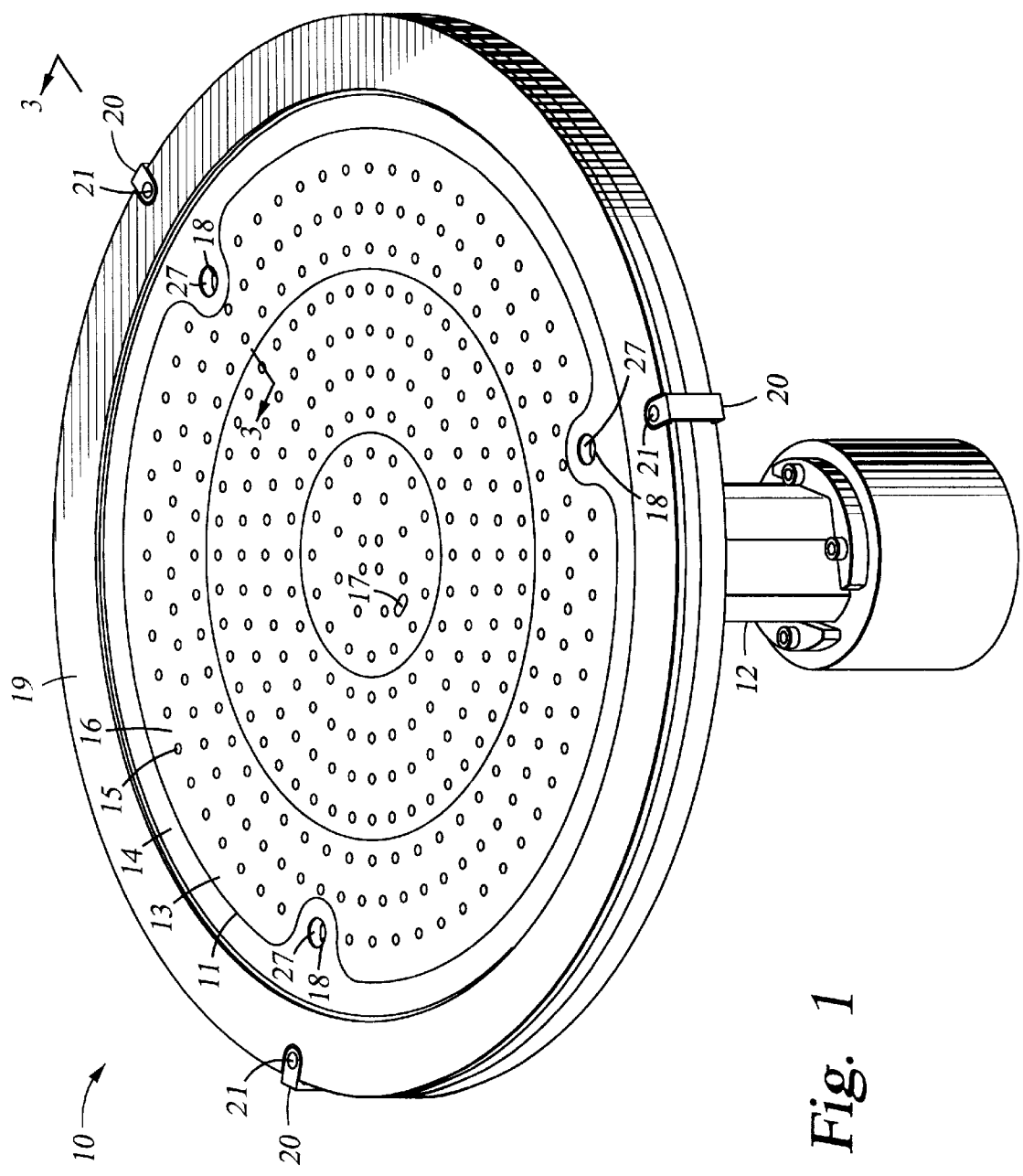
FIG. 1 is a perspective view of the apparatus of the present invention.
Figure 2:
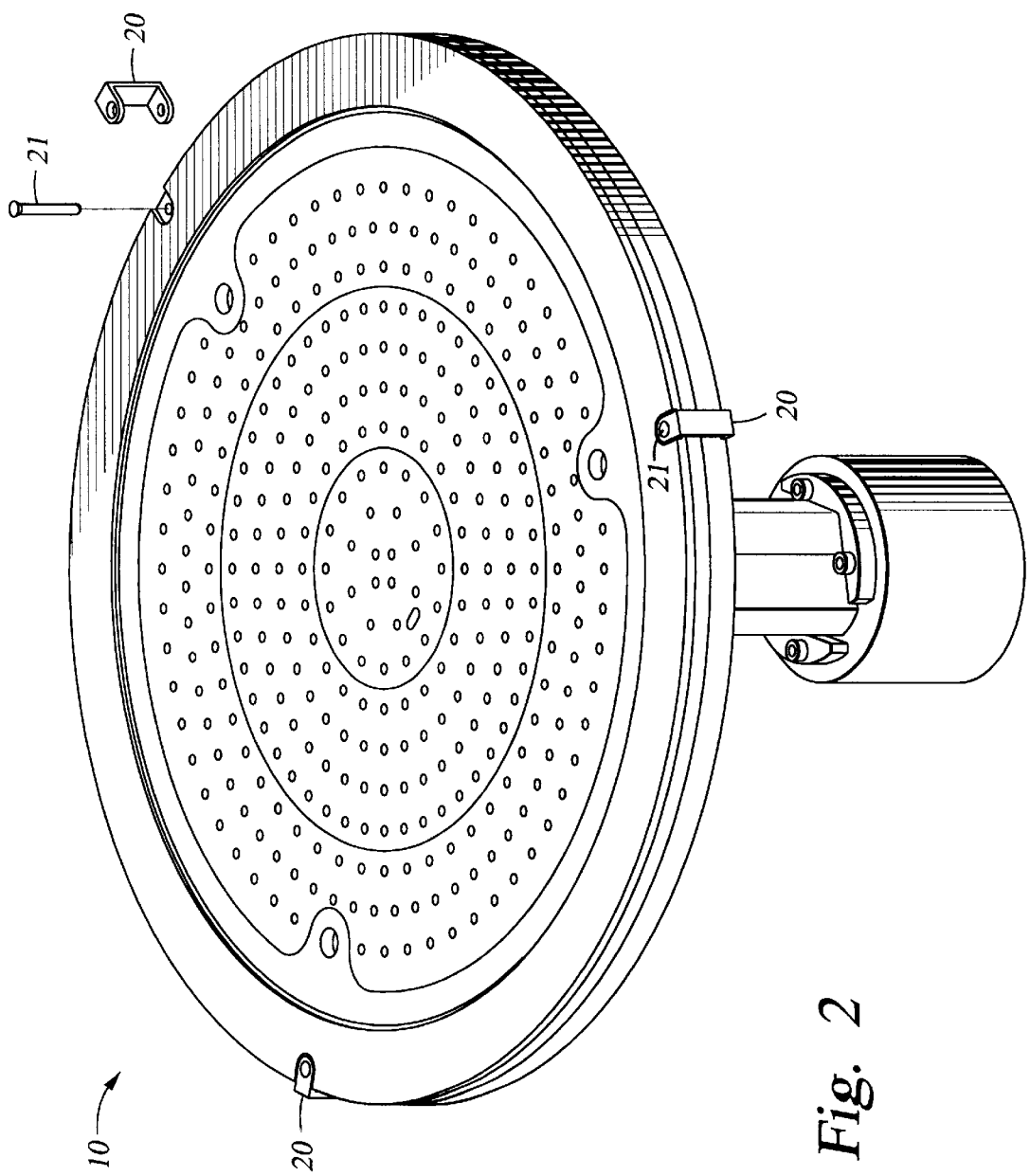
FIG. 2 is an exploded perspective view of the fastener device of FIG. 1.

The present invention generally provides a substrate support member having a purge ring supported thereon and mounted thereto using a fastening device. FIGS. 1 and 2 generally illustrate one embodiment of the present invention. As shown in FIG. 1, the substrate support comprises a heater pedestal 10 having a main body 11 supported on a vertically movable stem 12. The main body 11 has an upper face 13 defining a substrate supporting surface 14. To facilitate heat transfer between the upper face 13 of the heater pedestal 10 and the substrate, the substrate is preferably chucked, or adhered, to the upper face 13 using a vacuum. Generally, to accomplish the distribution of the vacuum, the upper face 13 of the heater pedestal 10 includes raised areas 15 adapted to support a substrate thereon and recessed areas 16 adapted to support a low pressure region via fluid communication with a vacuum supply from a vacuum introduced through a vacuum port 17. The heater pedestal 10 may further include recesses 27 in which lift pins 18 which move vertically under action of a motion actuating assembly (not shown) to lift the substrate clear of the upper face 13 of the heater pedestal 10. A purge member 19 is positioned on the heater pedestal 10 and adjacent to the periphery of the substrate supporting surface 14. The purge gas channel formed by the purge member 19 is further discussed below in Figure in 3.

A fastening device comprising a C-clamp 20 is releasably positioned over the purge member 19 and the main body 11 of the heater pedestal 10 to prevent vertical displacement of the purge member 19. A pin 21 is releasably inserted into the clamp 20, the purge member 19, and the main body 11 to releasably secure the clamp 20 on the support member. The pin 21 allows easy removal of the clamp 20 and the purge member 19 which facilitates cleaning or replacement of the purge member 19 and the heater pedestal 10 and thereby increases the productivity of the system. Furthermore, the use of the clamp 20 and the pin 21 with ceramic components reduces the likelihood of damage to the heater pedestal 10 and the purge member 19. Preferably, the purge member 19 is secured to the main body using three clamps 20 and three pins 21. In addition, as shown in FIG. 2, a slot 22 can be formed in the purge member 19 for the placement of the clamp 20. The slot 22 enables alignment of the clamp 20 and further prevents rotational displacement of the purge member 19 relative to the support member.

Figure 3:
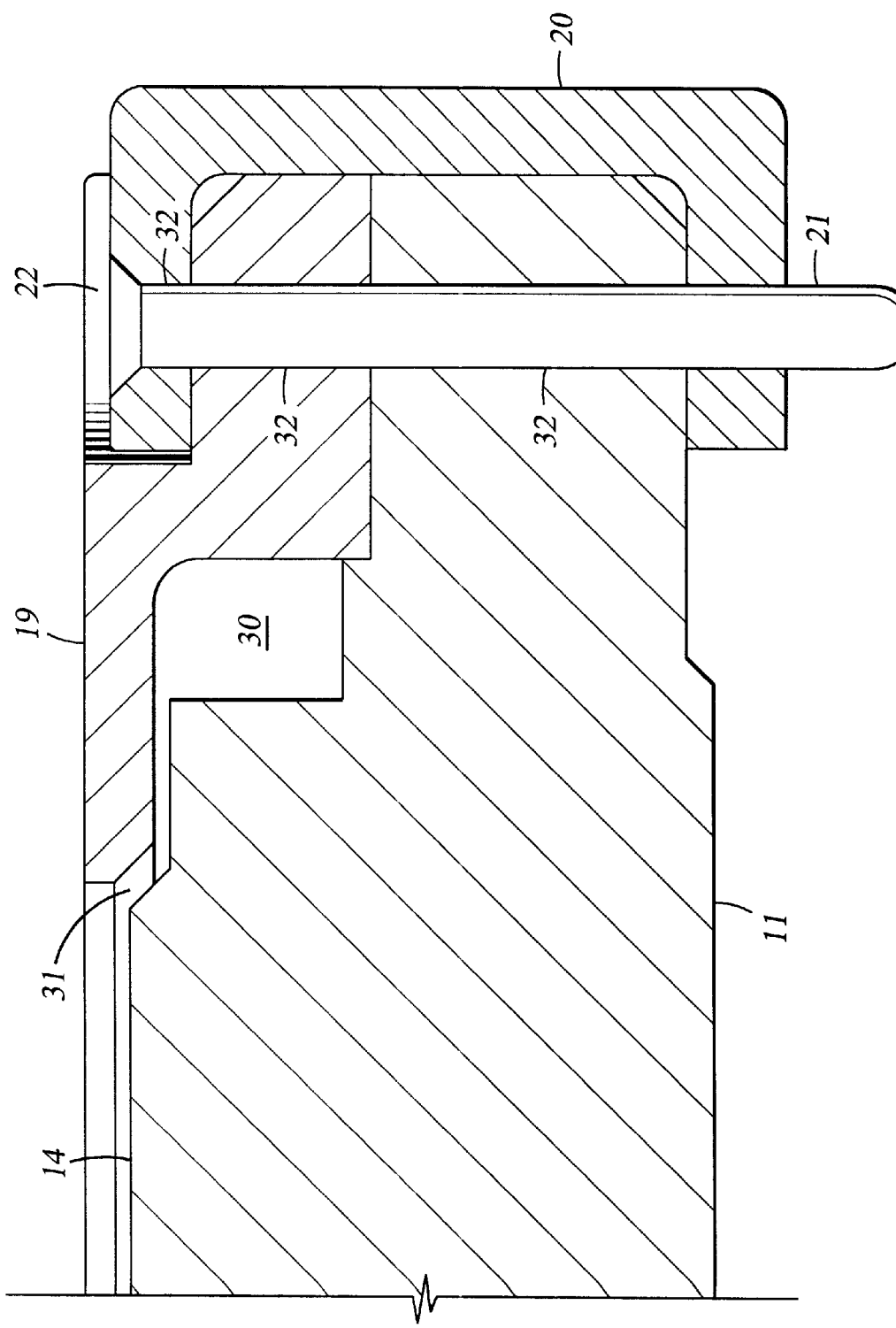
FIG. 3 is a side cross-sectional view of the fastener device taken along lines 3—3 in FIG. 1.

FIG. 3 is a cross-sectional view of the edge of the heater pedestal 10. The purge member 19 and the main body 11 of the heater pedestal 10 form a plenum 30 which directs a purge gas through an exit gap 31 to the perimeter portion of the substrate supporting surface 14. The main body 11, purge member 19, and the clamp 20 have a bore 32 formed therein to releasably receive the pin 21 which prevents rotational displacement of the purge member 19. A slot 22 can be formed in the purge member 19 for the placement of the clamp 20. Alternatively, slots can also be formed in both the main body 11 and the purge member 19 or only in the main body 11 to further assist alignment and prevent rotation of the purge member 19.

The heater pedestal 10, the purge member 19, the clamp 20, and the pin 21 are preferably made of ceramic materials such as alumina or aluminum nitride. The above components need not be made of the same ceramic material but should be made of ceramic materials with similar rates of thermal expansion. Ceramic materials are better suited for use at high temperatures. Some of the problems with the conventional use of aluminum materials in CVD systems are aluminum corrosion, temperature limitations, and unwanted deposition. Plasma gas may cause aluminum corrosion which leads to processing degradation relating to metal contamination in the devices. Aluminum is an inappropriate material for use at high temperatures, because at temperatures greater than about 480° C., aluminum experiences softening, possibly resulting in warpage. When aluminum is used above about 480° C. in the presence of a plasma, the aluminum may backsputter contaminating the substrate and chamber components. Thus, one application the present invention is ideally suited for is plasma-enhanced CVD of tungsten at high temperatures.

The present invention provides a reliable, easy-to-use apparatus that will prevent movement of the purge ring without causing damage to the pedestal, the purge ring, or the substrate. While the foregoing is directed to the preferred embodiment of the present invention, other and further embodiments of the invention may be devised including, but not limited to, a fastening device comprising of a clamp or a fastening device comprising of a pin. Still other and further embodiments of the invention may be devised without departing from the basic scope thereof, and the scope thereof is determined by the claims that follow.

What is claimed is:

1. An apparatus for directing a purge gas to the edge of a substrate, comprising:
   a substrate support defining a substrate receiving surface;
   a removable purge member disposed on the substrate support;
   a plenum formed between the purge member and the substrate support, wherein the plenum receives the purge gas from a gas source and directs the purge gas to the edge of the substrate; and
   a fastener which releasably holds the purge member and the substrate support together, wherein the fastener is configured to prevent vertical and rotational displacement of the purge member.

2. The apparatus of claim 1, wherein the fastener comprises:
   at least one clamp;
   a pin for each at least one clamp;
   the at least one clamp, the support member, and the purge member having a bore formed therein to releasably receive a pin; and
   the pin releasably inserted into the bore through the at least one clamp, the support member, and the purge member.

3. The apparatus of claim 1, wherein the fastener comprises:
   at least one pin;
   the support member and the purge member having a bore formed therein to releasably receive the at least one pin; and
   the at least one pin releasably inserted into the bore through the support member and the purge member.

4. The apparatus of claim 1, wherein the fastener comprises at least one clamp.

5. The apparatus of claim 2, further comprising a slot formed in the purge member for each at least one clamp, wherein the slot releasably receives the at least one clamp.

6. The apparatus of claim 2, wherein the substrate support, the purge member, the at least one clamp, and the pin are made of ceramic.

7. The apparatus of claim 2, wherein the substrate support further comprises lift pins, wherein the lift pins lift the substrate from the upper surface of the substrate support.

8. The apparatus of claim 2, wherein the purge member has at least one hole to releasably receive a shadow ring.

9. The apparatus of claim 2, wherein the substrate support further comprises a heater element disposed inside the substrate support, wherein the substrate support acts as a heater plate to maintain the substrate at a desired temperature.

10. The apparatus of claim 9, wherein the substrate support further comprises a vacuum port formed on the upper surface of the substrate support.

11. The apparatus of claim 10, wherein the substrate support further comprises:
    raised areas on the upper surface of the substrate, wherein the raised areas support the substrate; and
    recessed areas on the upper surface of the substrate support, wherein the recessed areas are in communication with the vacuum port.

12. An apparatus for directing a purge gas to the edge of a substrate, comprising:
    a substrate support defining a substrate receiving surface;
    a purge member disposed on the substrate support;
    a plenum formed between the purge member and the substrate support, wherein the plenum receives the purge gas from a gas source and directs the purge gas to the edge of the substrate;
    three clamps;
    three pins;
    the three clamps, the support member, and the purge member having bores formed therein to releasably receive the three pins; and
    the three pins releasably inserted into the bores through the three clamps, the support member, and the purge member.

13. A chamber for processing a substrate, comprising:

a substrate support defining a substrate receiving surface;

a removable purge member disposed on the substrate support;

a plenum formed between the purge member and the substrate support, wherein the plenum receives the purge gas from a gas source and directs the purge gas to the edge of the substrate; and a fastener which releasably holds the purge member and the substrate support together, wherein the fastener is configured to prevent vertical and rotational displacement of the purge member.

14. The chamber of claim 13, wherein the fastener comprises:

at least one clamp;

a pin for each at least one clamp;

the at least one clamp, the support member, and the purge member having a bore formed therein to releasably receive a pin;

the pin releasably inserted into the bore through the at least one clamp, the support member, and the purge member; and a slot formed in the purge member for each at least one clamp, wherein the slot releasably receives the at least one clamp.

15. The chamber of claim 14, wherein the substrate support is a heater pedestal.

16. The chamber of claim 15, wherein the chamber is a chemical vapor deposition chamber.

17. The chamber of claim 16, wherein the chamber further comprises a RF source.

18. The chamber of claim 17, wherein the heater pedestal, the purge member, the at least one clamp, and the pin are made of ceramic.

19. The chamber of claim 18, wherein the chamber deposits tungsten.

20. The chamber of claim 14, wherein the purge member has at least one hole to releasably receive a shadow ring.

* * * * *